(12) United States Patent
Xie et al.

(10) Patent No.: US 10,937,693 B2
(45) Date of Patent: Mar. 2, 2021

(54) METHODS, APPARATUS AND SYSTEM FOR A LOCAL INTERCONNECT FEATURE OVER AN ACTIVE REGION IN A FINFET DEVICE

(71) Applicant: GLOBALFOUNDRIES INC., Grand Cayman (KY)

(72) Inventors: Ruilong Xie, Niskayuna, NY (US); Andreas Knorr, Saratoga Springs, NY (US); Haiting Wang, Clifton Park, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 5 days.

(21) Appl. No.: 16/150,026

(22) Filed: Oct. 2, 2018

(65) Prior Publication Data

US 2020/0105597 A1 Apr. 2, 2020

(51) Int. Cl.
*H01L 21/768* (2006.01)
*H01L 29/66* (2006.01)
*H01L 21/285* (2006.01)
*H01L 21/02* (2006.01)

(52) U.S. Cl.
CPC .... *H01L 21/76897* (2013.01); *H01L 21/0217* (2013.01); *H01L 21/02167* (2013.01); *H01L 21/28518* (2013.01); *H01L 21/76805* (2013.01); *H01L 21/76832* (2013.01); *H01L 21/76834* (2013.01); *H01L 21/76895* (2013.01); *H01L 29/66795* (2013.01)

(58) Field of Classification Search
None
See application file for complete search history.

(56) References Cited

U.S. PATENT DOCUMENTS

| | | | | |
|---|---|---|---|---|
| 2015/0364326 | A1* | 12/2015 | Xie | H01L 29/665 257/288 |
| 2017/0317076 | A1* | 11/2017 | Shen | H01L 21/76831 |
| 2018/0025942 | A1* | 1/2018 | Cheng | H01L 29/4991 257/382 |
| 2019/0148225 | A1* | 5/2019 | Chen | H01L 29/41791 257/384 |

* cited by examiner

*Primary Examiner* — Nicholas J Tobergte
*Assistant Examiner* — Kien C Ly
(74) *Attorney, Agent, or Firm* — Williams Morgan, P.C.

(57) ABSTRACT

At least one method, apparatus and system disclosed herein involves forming local interconnect regions during semiconductor device manufacturing. A plurality of fins are formed on a semiconductor substrate. A gate region is over a portion of the fins. A trench silicide (TS) region is formed adjacent a portion of the gate region. The TS region comprises a first TS metal feature and a second TS metal feature. A bi-layer self-aligned contact (SAC) cap is formed over a first portion of the TS region and electrically coupled to a portion of the gate region. A portion of the bi-layer SAC cap is removed to form a first void. A first local interconnect feature is formed in the first void.

9 Claims, 12 Drawing Sheets

CBoA

Fig. 12

CA over TS

METHODS, APPARATUS AND SYSTEM FOR A LOCAL INTERCONNECT FEATURE OVER AN ACTIVE REGION IN A FINFET DEVICE

BACKGROUND OF THE INVENTION

Field of the Invention

Generally, the present disclosure relates to the manufacture of sophisticated semiconductor devices, and more specifically, to forming a novel local interconnect feature over an active region in a finFET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

Using one of various techniques, a plurality of fins are formed on substrate. A plurality of layers of materials that may be deposited on the fins. Some of the fins are designated to be source or drain fins, while a gate area is formed above the fins between the source and drain regions. Further, metal features are formed to provide interconnections between different features formed on the substrate. For example, interconnection between gates may be formed using a local interconnection, middle-of-line (MOL) features (e.g., a CB feature). Another example of the MOL interconnection feature may be a connection between a metal feature and a trench silicide (TS), e.g., CA feature. Designers have used different materials in an attempt to improve accuracy of self-aligned contact (SAC) caps as well as leakage current problems when forming MOL features. However, the industry generally lacks a robust method of improving accuracy and leakage current issues associated with forming CA and CB features.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming local interconnect regions during semiconductor device manufacturing. A plurality of fins on a semiconductor substrate are formed. A gate region is over a portion of the fins. A trench silicide (TS) region is formed adjacent a portion of the gate region. The TS region comprises a first TS metal feature and a second TS metal feature. A bi-layer self-aligned contact (SAC) cap is formed over a first portion of the TS region and electrically coupled to a portion of the gate region. A portion of the bi-layer SAC cap is removed to form a first void. A first local interconnect feature is formed in the first void.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein call for forming a bi-layer SAC cap for forming MOL features, such as CB contact over an active layer (CBoA) and/or a CA contact. In some embodiments, the SAC cap may be formed with an outer layer that is thicker than the previously formed spacer. For example, the inner spacer may be formed using SiBCN material, and the outer layer may be formed using SiN material.

Embodiments herein may also call for forming a bi-layer TS cap. In some embodiments, the TS cap may be formed from an inner oxide liner and an outer SiN liner. The TS oxide may be substantially isolated from the TS metal (e.g., Co) using the outer SiN liner. Subsequently, self-aligned gate and source/drain (S/D) contacts may be formed. This process may provide various advantages, including improved accuracy in formation of MOL features.

Figure 1A:
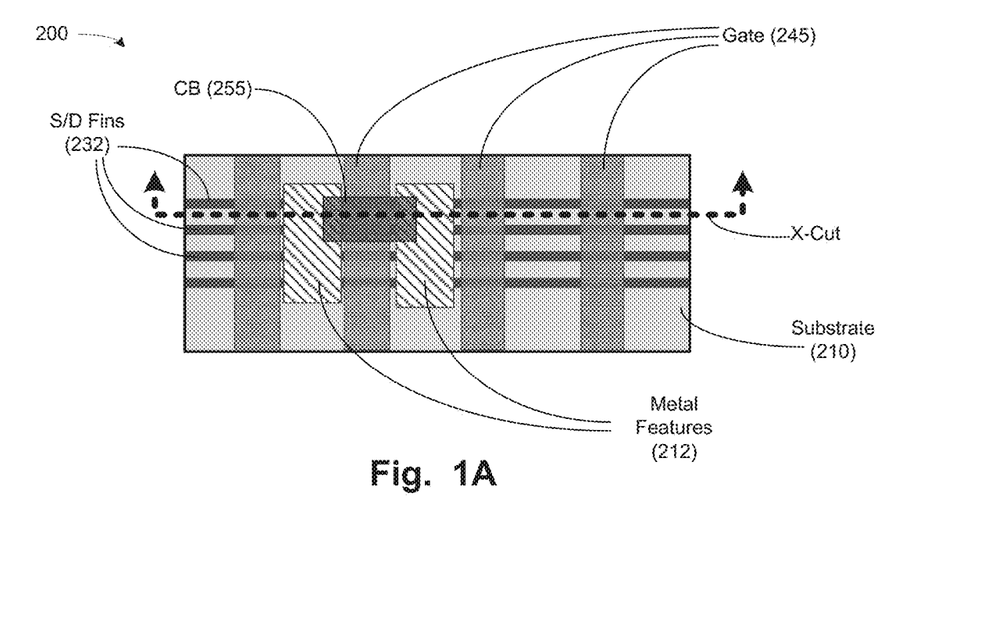
FIG. 1A illustrates a stylized, simplified top view of a finFET device having a CB feature, in accordance with embodiments herein.
Figure 1B:
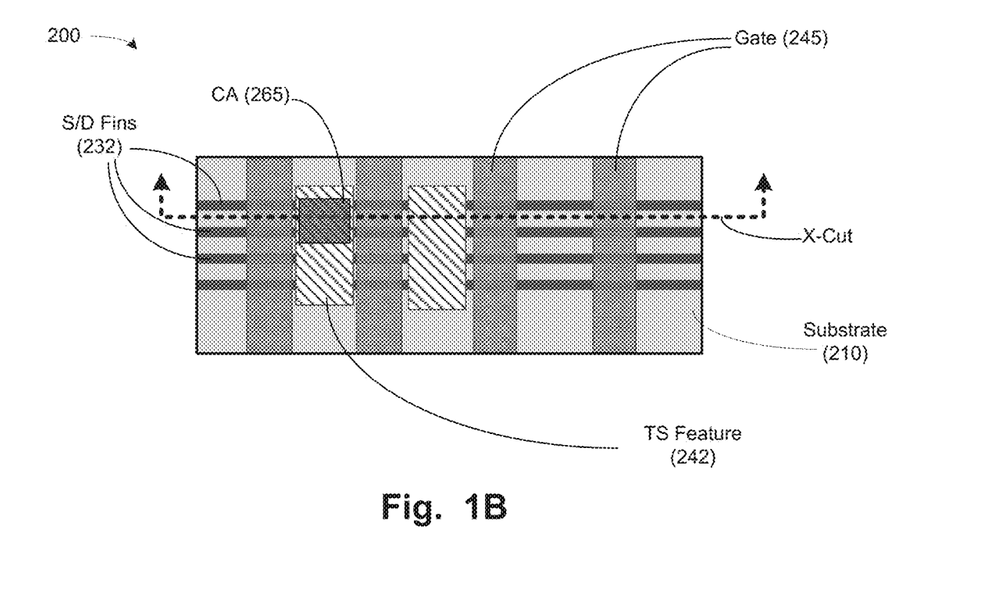
FIG. 1B illustrates a simplified top view of a finFET device having a CA feature, in accordance with embodiments herein.

Turning now to FIG. 1A, a stylized, simplified top view of a finFET device having a CB feature, in accordance with embodiments herein, is illustrated. FIG. 1B illustrates a simplified top view of a finFET device having a CA feature, in accordance with embodiments herein. FIGS. 1A and 1B illustrate an integrated circuit device 200 comprising a plurality of fins 232 formed on a substrate 210. Further, FIGS. 1A and 1B illustrate a plurality of gate formations 245. In some embodiments, the device 200 may include an amorphous silicon layer (a-Si) formation in an oxide layer.

FIG. 1A also depicts a plurality of metal features 212 that may be formed in the upper metal layers of the device 200. The metal features 212 may be formed from copper, cobalt, or other metals appropriate for semiconductor wafer processing. One or more CB metal formations 255 may be formed for interconnecting a gate feature 245 to one or more metal features 212.

As shown in FIG. 1B, adjacent some of the gates formations 245 are a plurality of trench silicide (TS) features 242. The TS features 242 that may be used to provide connections to predetermined source/drain regions. As such, the TS features 242 may eventually become source/drain contacts. One or more CA metal formations 265 may be used to connect to a TS feature 242, thereby providing electrical connection to selected source/drain regions.

FIGS. 1A and 1B also show an X-cut line provided for reference with respect to a cross-sectional view shown in subsequent figures. FIGS. 2-19 represent stylized cross-sectional views of finFET devices with respect to the X-cut line, in accordance with exemplary embodiments herein.

Figure 2:
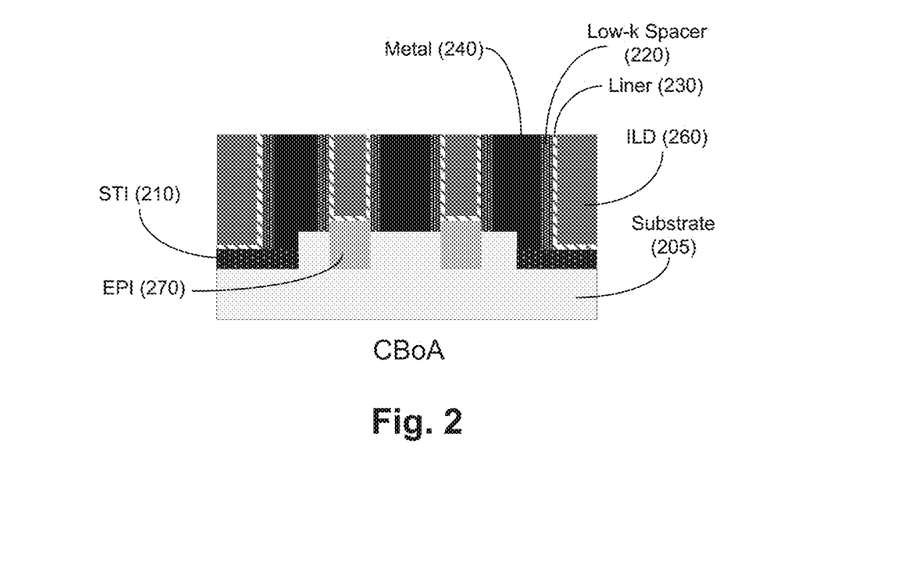
FIG. 2 illustrates a stylized depiction of a cross-sectional view across a plurality of gate regions over fins with respect to FIG. 1A, in accordance with embodiments herein.
Figure 3:
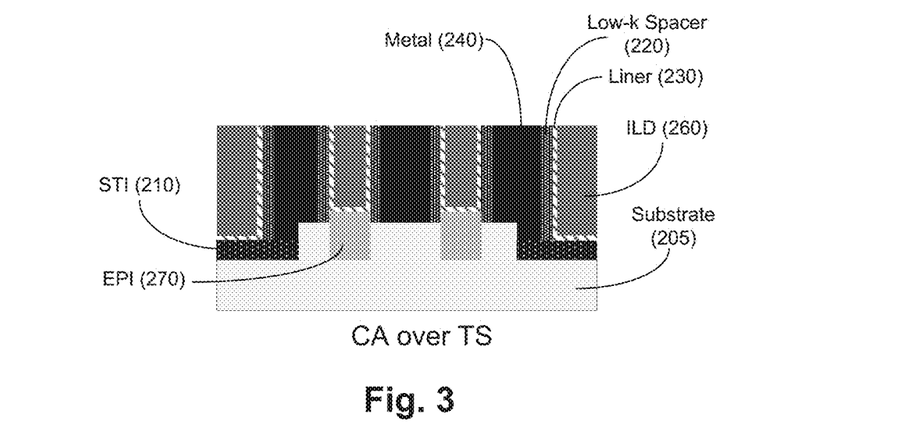
FIG. 3 illustrates a stylized depiction of a cross-sectional view across a plurality of gate regions over fins with respect to FIG. 1B, in accordance with embodiments herein.

Turning simultaneously now to FIGS. 2 and 3, FIG. 2 illustrates a stylized depiction of a cross-sectional view across a plurality of gate regions over fins with respect to FIG. 1A, in accordance with embodiments herein. FIG. 3 illustrates a stylized depiction of a cross-sectional view across a plurality of gate regions over fins with respect to FIG. 1B, in accordance with embodiments herein. Those skilled in the art having benefit of the present disclosure would appreciate that FIGS. 2 and 3 depict the device 200 after replacement metal gate (RMG) process has been performed.

As shown in FIGS. 2 and 3, the device 200 comprises a substrate 205 on which source/drain fins 232, EPI features 230, and gate regions are formed. The gate regions comprise a plurality of gate formations 245. Each of the gate formations 245 comprises a gate metal 240 (i.e., a hi-k metal gate region). The gate metal 240 may be encompassed by a low-k spacer 220, which in one embodiment may be s SiCoN liner. Further, adjacent the low-k spacer 200, a contact etch-stop liner (CESL) 230 may be formed. Adjacent the CESL 230 are inter-layer dielectric (ILD) features 260.

FIGS. 2 and 3 also show an STI region 210, on which a portion of some gate formations 245 are formed. Further, below some of the ILD feature 260, epitaxial (EPI) features 270 may be formed.

Figure 4:
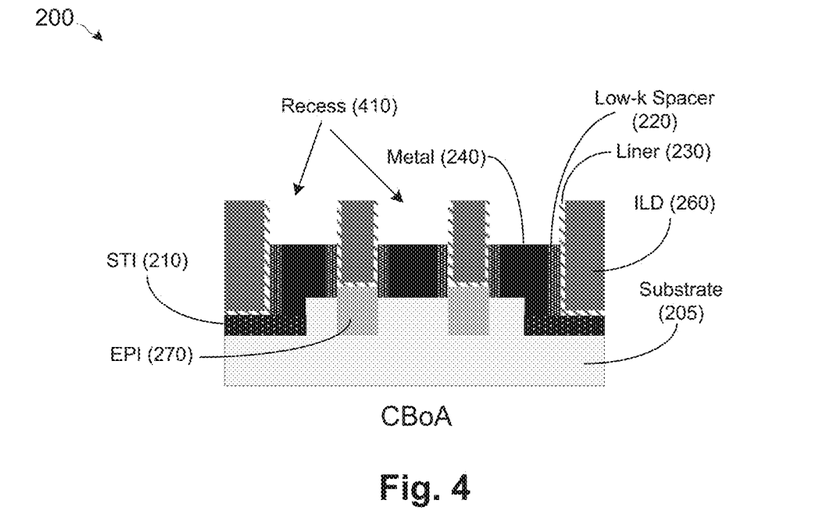
FIG. 4 illustrates a stylized depiction of a cross-sectional view of the device of FIG. 1A with respect a metal and low-k spacer recess process, in accordance with embodiments herein.
Figure 5:
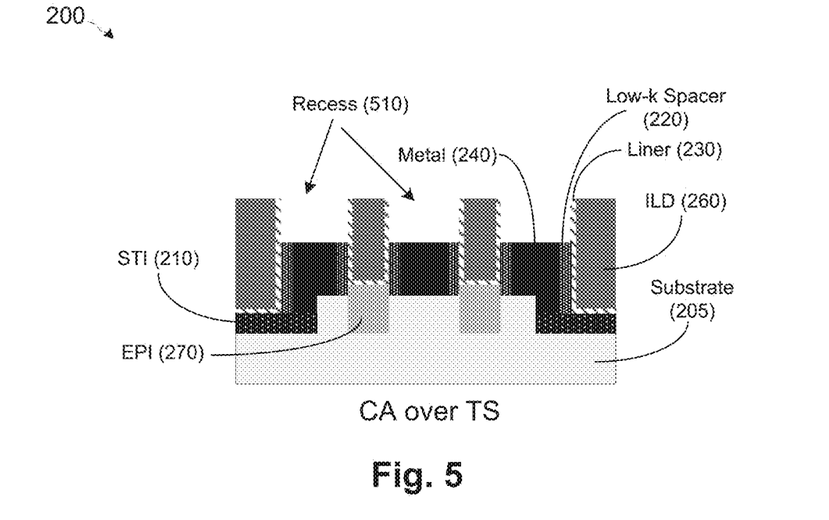
FIG. 5 illustrates a stylized depiction of a cross-sectional view of the device of FIG. 1B with respect a metal and low-k spacer recess process, in accordance with embodiments herein.

Subsequently in the processing cycle, a metal and low-k spacer recess process may be performed. This process may comprise one or more etch processes. Turning now simultaneously to FIGS. 4 and 5, FIG. 4 illustrates a stylized depiction of a cross-sectional view of the device 200 relating to FIG. 1A with respect a metal and low-k spacer recess process, in accordance with embodiments herein. FIG. 5 illustrates a stylized depiction of a cross-sectional view relating to FIG. 1B with respect a metal and low-k spacer recess process, in accordance with embodiments herein.

A metal (e.g., high-k metal such as W) recess process may be performed in the CB region (FIG. 4) and in the CA region (FIG. 5). In some embodiments a selective etch process may be performed to remove a portion of the metal region 240. Further, a low-k spacer etch process may be performed to remove a portion of the low-k spacer 220. The removal of portions of the metal region 240 and the low-k spacer 220 results in a recess regions 410 in the CB region (FIG. 4) and recess regions 510 in the CA region (FIG. 5).

Figure 6:
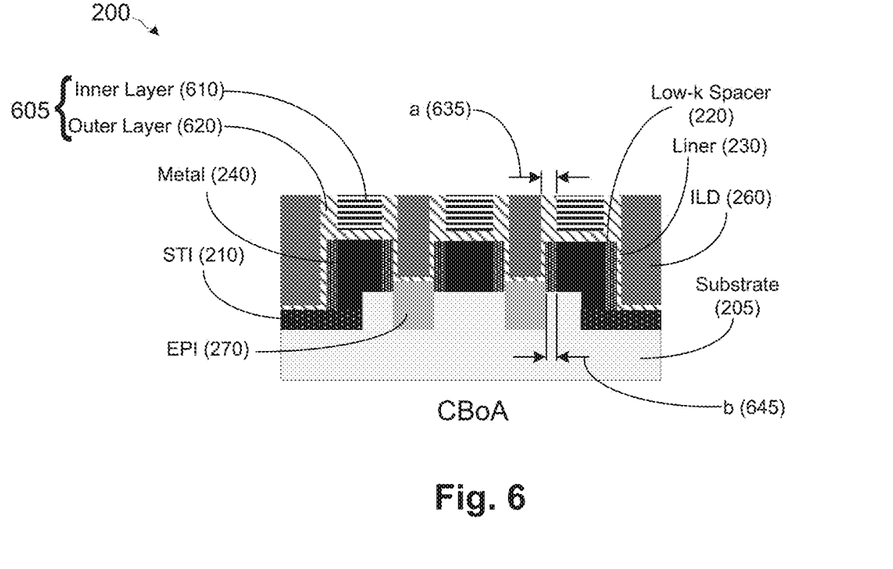
FIG. 6 illustrates a stylized depiction of a cross-sectional view of the device of FIG. 1A with respect a bi-layer SAC cap formation process, in accordance with embodiments herein.
Figure 7:
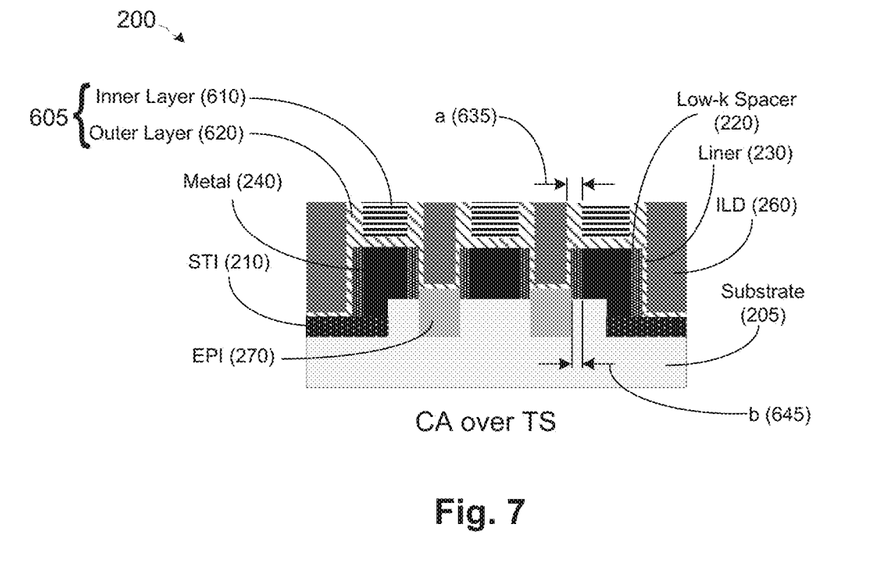
FIG. 7 illustrates a stylized depiction of a cross-sectional view of the device of FIG. 1B with respect a bi-layer SAC cap formation process, in accordance with embodiments herein.

Subsequently in the processing cycle, a bi-layer SAC cap may be formed. This process may comprise a plurality of deposition and CMP processes. Turning now simultaneously to FIGS. 6 and 7, FIG. 6 illustrates a stylized depiction of a cross-sectional view of the device 200 relating to FIG. 1A with respect a bi-layer SAC cap formation process, in accordance with embodiments herein. FIG. 7 illustrates a stylized depiction of a cross-sectional view relating to FIG. 1B with respect a bi-layer SAC cap formation process, in accordance with embodiments herein.

A bi-layer SAC cap 605 may be formed in the recesses 410, 510 (FIGS. 4 and 5), as shown in FIGS. 6 and 7. An outer layer 620 of the bi-layer SAC cap 605 may be formed, lining the recesses 410, 510, leaving a small gap with in the outer layer 620. In one embodiment, the outer layer 620 may be formed from silicon nitride. The outer layer 620 is formed with a $1^{st}$ thickness ("a"), denoted by the reference number 630, as shown in FIGS. 6 and 7. The $1^{st}$ thickness, a, is greater than a $2^{nd}$ thickness ("b") of the CESL liner 230 below the outer layer 620, wherein the $2^{nd}$ thickness, b is denoted by the reference number 645.

The gap remaining within the outer layer 620 may be filled with another material, forming an inner layer 610 of the bi-layer SAC cap 605. In one embodiment, the inner layer 610 may be made of SiBCN. The inner layer 610 and the outer layer 620 may then be polished down to a predetermined level. The combination of the inner and outer layer 610, 620 form the bi-layer SAC cap 605.

Figure 8:
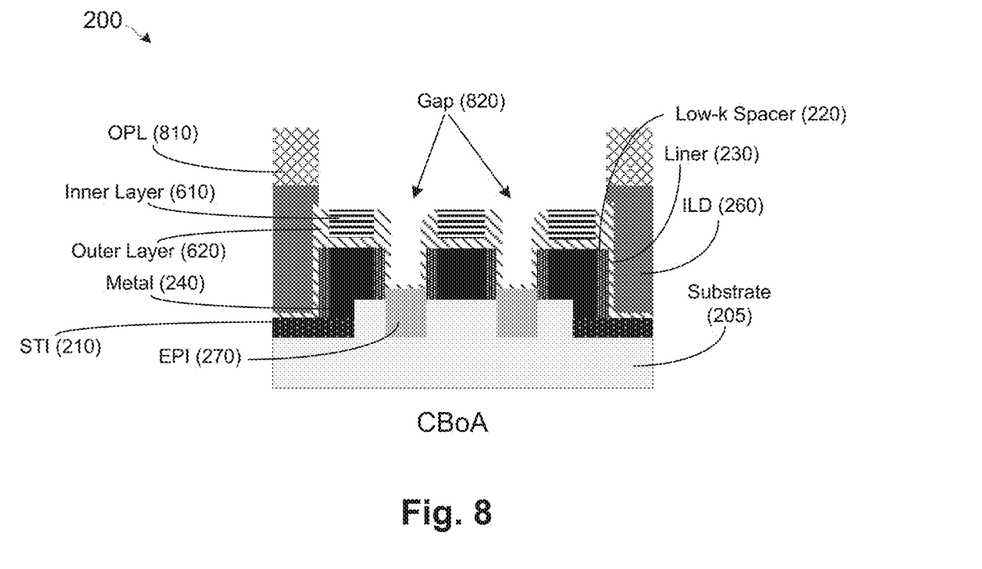
FIG. 8 illustrates a stylized depiction of a cross-sectional view of the device of FIG. 1A with respect a TS RIE process, in accordance with embodiments herein.
Figure 9:
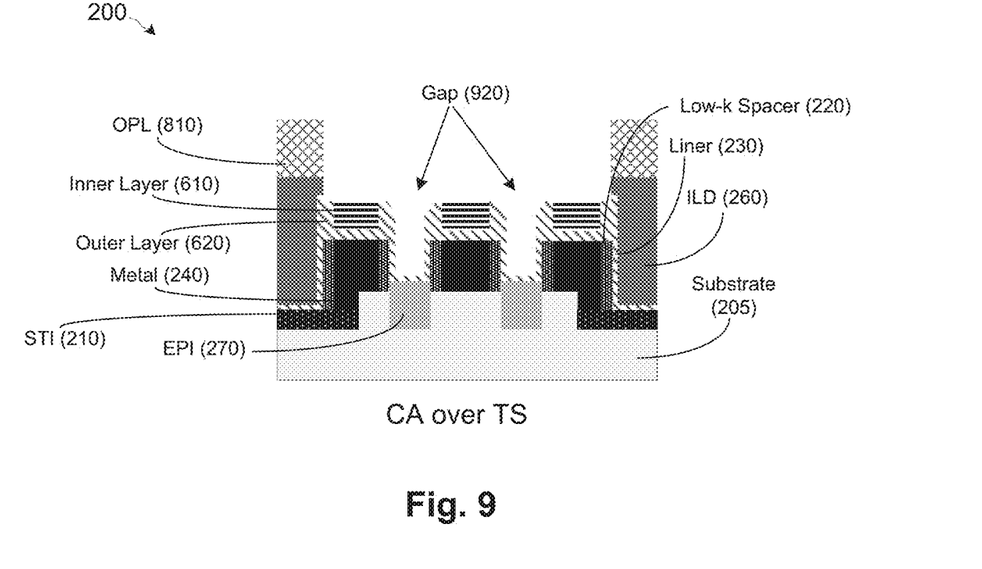
FIG. 9 illustrates a stylized depiction of a cross-sectional view relating to the device of FIG. 1B with respect a TS RIE process, in accordance with embodiments herein.

Subsequently in the processing cycle, a TS RIE process may be performed. This process may comprise a plurality of etch and deposition processes. Turning now simultaneously to FIGS. 8 and 9, FIG. 8 illustrates a stylized depiction of a cross-sectional view of the device 200 relating to FIG. 1A with respect a TS RIE process, in accordance with embodiments herein. FIG. 9 illustrates a stylized depiction of a cross-sectional view relating to FIG. 1B with respect a TS RIE process, in accordance with embodiments herein.

A reactive-ion etching (ME) process may be performed over the CB region (FIG. 8) and the CA region (FIG. 9). The RIE process results in gaps 820 in the CB area (FIG. 8). The ME process also results in gaps in the CA over TS region (FIG. 9). The ME process may be performed such that a portion of the EPI features 270 may in the CB and CA regions may be exposed. Further, a layer of organic-planarization layer (OPL) layer 810 is deposited over regions adjacent the CB area (FIG. 8) and adjacent the CA over TS region (FIG. 9), and additional ILD material may be added in the manner shown in FIGS. 8 and 9.

Figure 10:
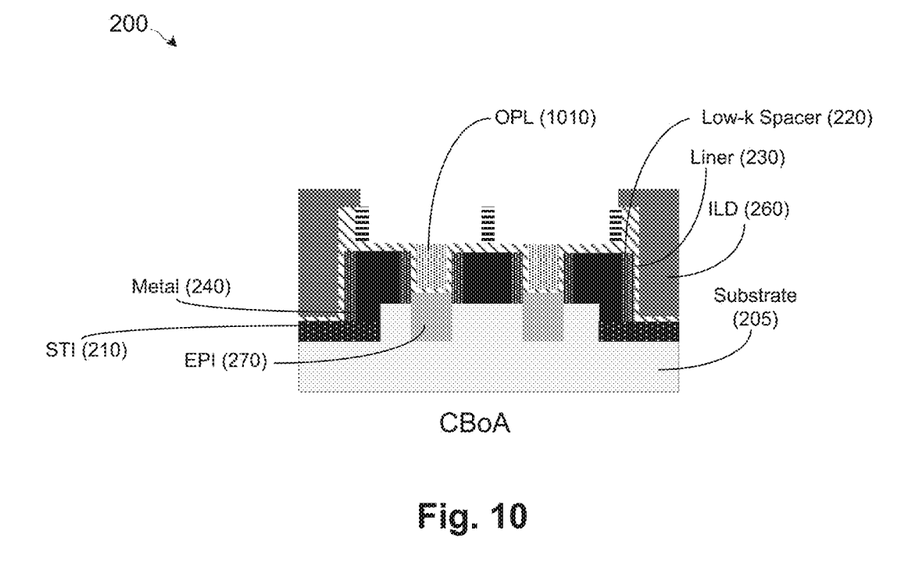
FIG. 10 illustrates a stylized depiction of a cross-sectional view of the device of FIG. 1A with respect an OPL deposition process and a selective spacer removal process, in accordance with embodiments herein.
Figure 11:
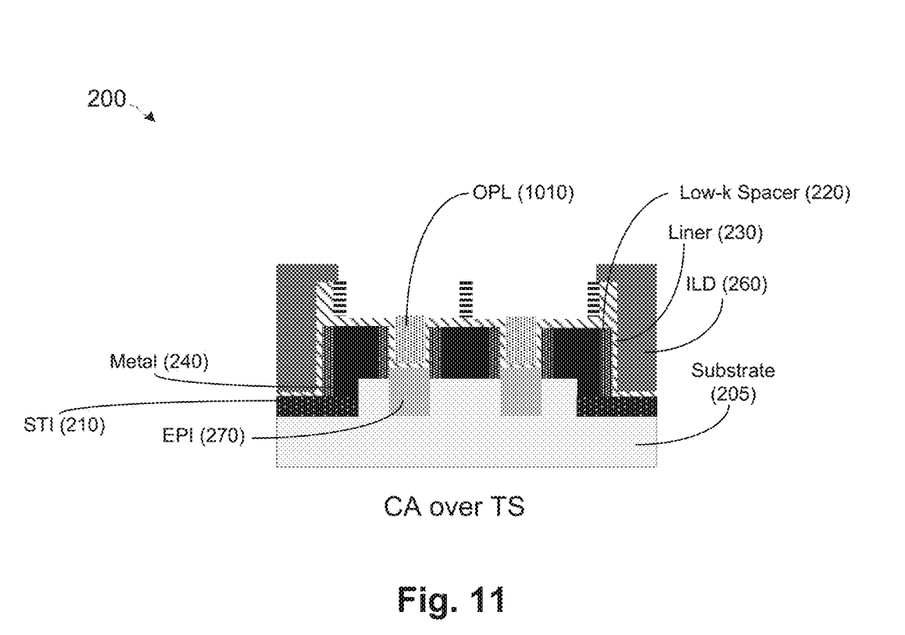
FIG. 11 illustrates a stylized depiction of a cross-sectional view relating to FIG. 1B with respect the OPL process and a selective spacer removal process, in accordance with embodiments herein.

Subsequently in the processing cycle, another OPL deposition and a selective spacer removal process may be performed. This process may comprise a plurality of etch and deposition processes to fill a portion of the gaps (820 and 920). Turning now simultaneously to FIGS. 10 and 11, FIG. 10 illustrates a stylized depiction of a cross-sectional view of the device 200 relating to FIG. 1A with respect an OPL deposition and selective spacer removal process, in accordance with embodiments herein. FIG. 11 illustrates a stylized depiction of a cross-sectional view relating to FIG. 1B with respect the OPL process and selective spacer removal process, in accordance with embodiments herein.

An OPL deposition process is performed. This process may fill in a predetermined portion of gaps in the CB and CA regions with OPL fill layer 1010s, as shown in FIGS. 10 and 11, respectively. Upon depositing the OPL material, a recess process, e.g., CMP process, may be performed to bring the OPL layer level down to a predetermined level and form OPL features shown in FIGS. 10 and 11.

Further, a spacer etch process is performed. The spacer etch process may include selectively removing the outer nitride layer 620 to the inner nitride layer 610. That is, in embodiments herein, the SiN layer (outer nitride layer 620) is selectively removed to the SiBCN (inner nitride layer 610). Thus, embodiments herein provide for improved control of corner modifications.

Figure 12:
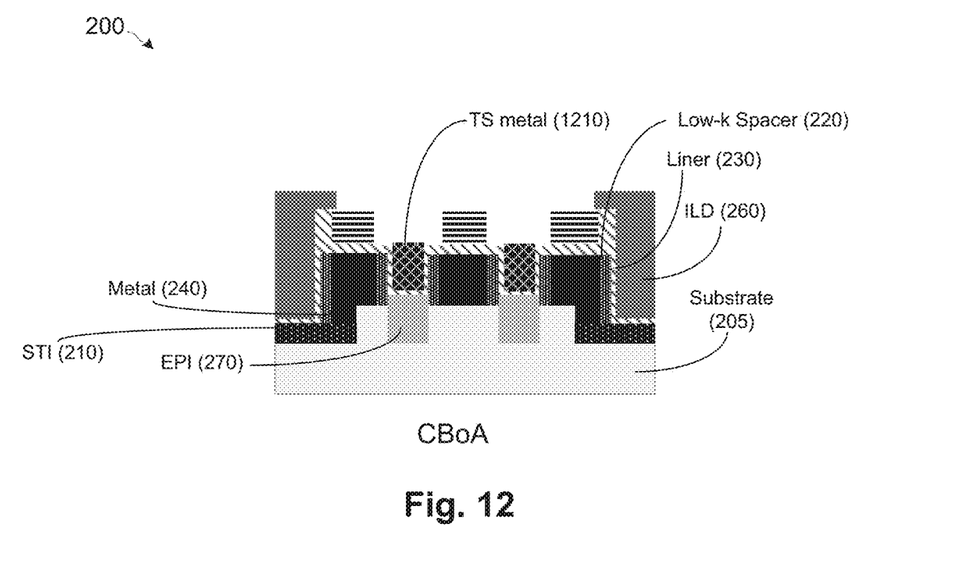
FIG. 12 illustrates a stylized depiction of a cross-sectional view of the device of FIG. 1A with respect an OPL strip and metallization processes, in accordance with embodiments herein.
Figure 13:
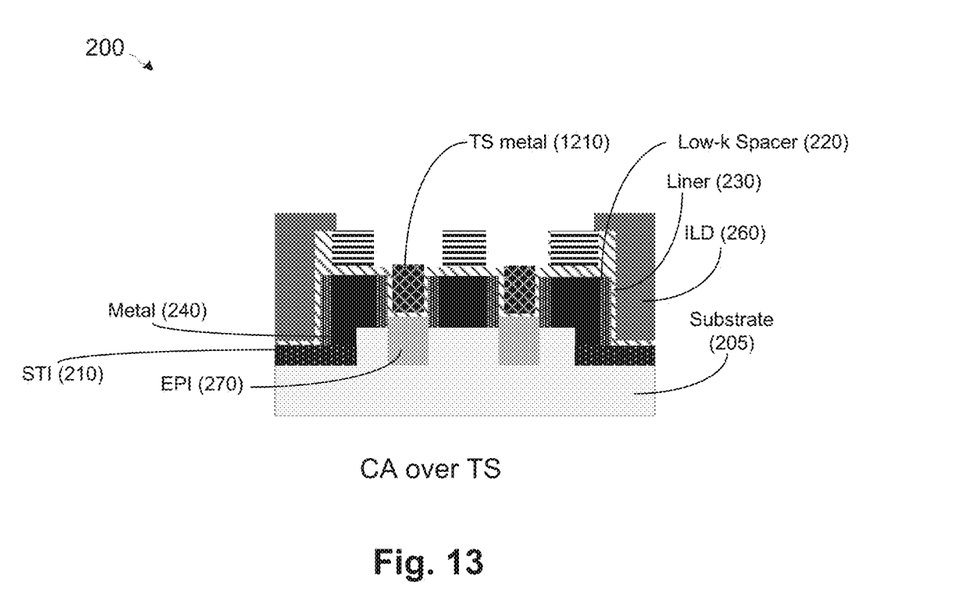
FIG. 13 illustrates a stylized depiction of a cross-sectional view relating to FIG. 1B with respect the OPL strip and metallization processes, in accordance with embodiments herein.

Subsequently in the processing cycle, an OPL strip and metallization process may be performed. This process may comprise a plurality of prosecco's, such as etch and deposition processes. Turning now simultaneously to FIGS. 12 and 13, FIG. 12 illustrates a stylized depiction of a cross-sectional view of the device 200 relating to FIG. 1A with respect an OPL strip and metallization processes, in accordance with embodiments herein. FIG. 13 illustrates a stylized depiction of a cross-sectional view relating to FIG. 1B with respect the OPL strip and metallization processes, in accordance with embodiments herein.

The OPL features that were formed in the gaps 820, 920 are removed. Further, metallization of the TS regions in the CB and CA areas are performed, forming metallized TS features 1210. This process involves multiple processes, including depositing TS metal and recessing the TS metal to a predetermined level. In one embodiment, the TS metal 1210 may be cobalt, while in other embodiments the TS metal 1210 may be formed of copper or tungsten.

Figure 14:
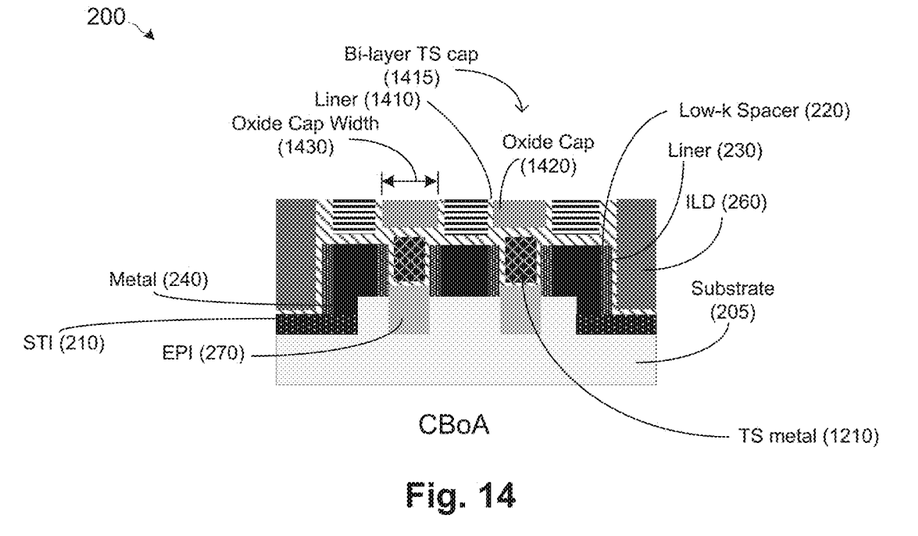
FIG. 14 illustrates a stylized depiction of a cross-sectional view of the device of FIG. 1A with respect a liner and oxide layer deposition processes, in accordance with embodiments herein.
Figure 15:
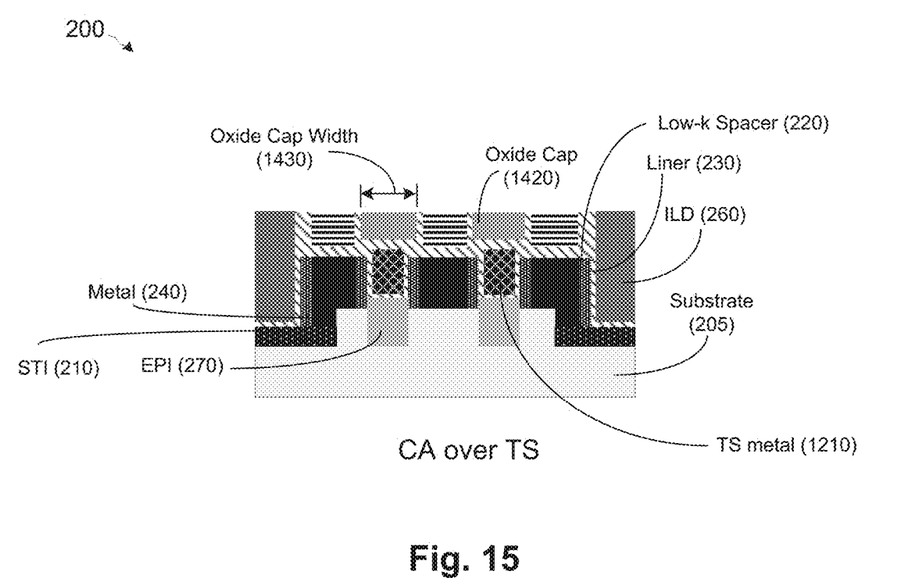
FIG. 15 illustrates a stylized depiction of a cross-sectional view relating to FIG. 1B with respect the liner and oxide layer deposition processes, in accordance with embodiments herein.

Subsequently in the processing cycle, a liner and oxide layer deposition processes may be performed. This process may comprise a plurality of processes, a SiN liner deposition process, an $SiO_2$ deposition process, and a CMP process. Turning now simultaneously to FIGS. 14 and 15, FIG. 14 illustrates a stylized depiction of a cross-sectional view of the device 200 relating to FIG. 1A with respect a liner and oxide layer deposition processes, in accordance with embodiments herein. FIG. 15 illustrates a stylized depiction of a cross-sectional view relating to FIG. 1B with respect the liner and oxide layer deposition processes, in accordance with embodiments herein.

A liner (e.g., SiN liner) 1410 is formed above the TS metal features 1210. This liner 1410 may also line the sidewalls of the inner layer 610 (SiBCN layer). Subsequently, an oxide layer (e.g., SiO$_2$ layer) may be deposited forming oxide caps 1420. The liner 1410 protects the TS metal features 1210 from oxidation. The liner 1410 may also protect the inner layer 610. The liner 1410 and the oxide caps 1420 together form a bi-layer TS cap 1415.

In one embodiment, the oxide caps 1410 may be at least wide as the width of the TS metal feature 1210 and the two spacers adjacent either side of the TS metal feature 1210. In this manner the oxide cap width 1430 is greater than the TS metal width plus twice "a" (oxide layer thickness (630 in FIG. 6). Since earlier in the process (e.g., FIGS. 6-7), the outer layer thickness 635 was formed to be greater than "b" (low-k spacer thickness 645), the oxide cap 1420 is prevented from shorting with the TS metal 1210.

Figure 16:
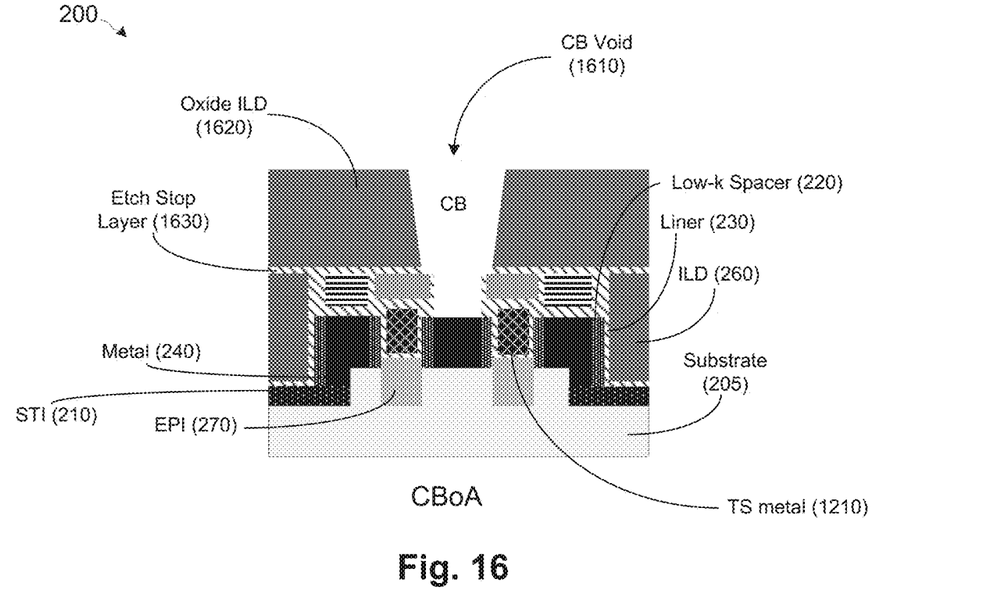
FIG. 16 illustrates a stylized depiction of a cross-sectional view of the device of FIG. 1A with respect to an RIE processes, in accordance with embodiments herein.
Figure 17:
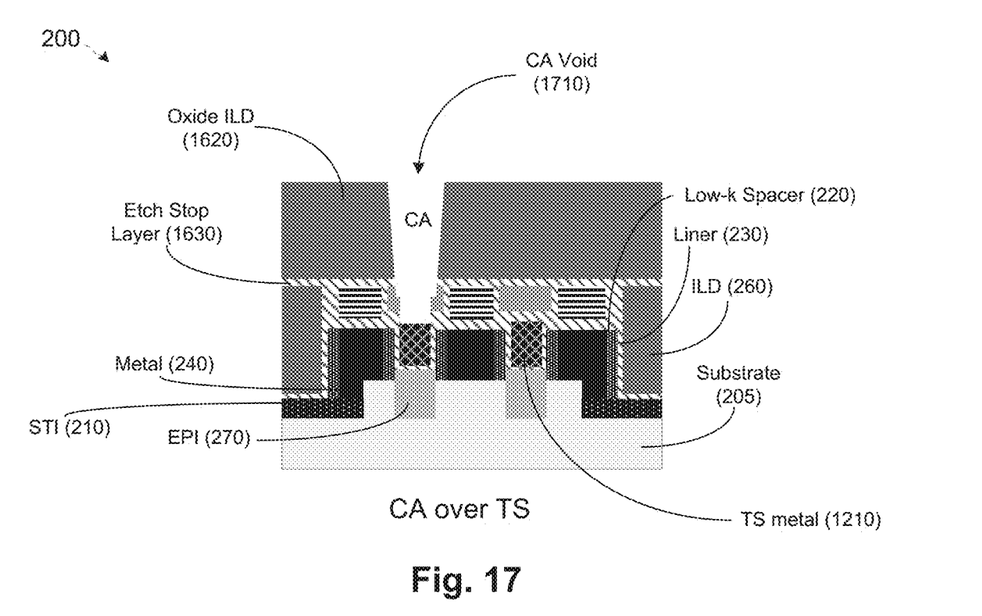
FIG. 17 illustrates a stylized depiction of a cross-sectional view relating to FIG. 1B with respect to the RIE processes, in accordance with embodiments herein.

Subsequently in the processing cycle, self-aligned CB RIE and CA RIE processes processes may be performed. Turning now simultaneously to FIGS. 16 and 17, FIG. 16 illustrates a stylized depiction of a cross-sectional view of the device 200 relating to FIG. 1A with respect to CB and CA RIE processes, in accordance with embodiments herein. FIG. 17 illustrates a stylized depiction of a cross-sectional view relating to FIG. 1B with respect to the CB and CA RIE processes, in accordance with embodiments herein.

An etch stop layer (e.g., SiN layer) 1630 may be formed. Further, an inter-layer dielectric (ILD) layer 1620 is formed over the etch stop layer 1630. In one embodiment, the ILD layer 1620 may be an oxide layer. A self-aligned RIE process is performed in the CA region (FIG. 16) and the CB region (FIG. 17). As result, a CB void 1610 (FIG. 16) and a CA void (FIG. 17) are created over the TS features.

Figure 18:
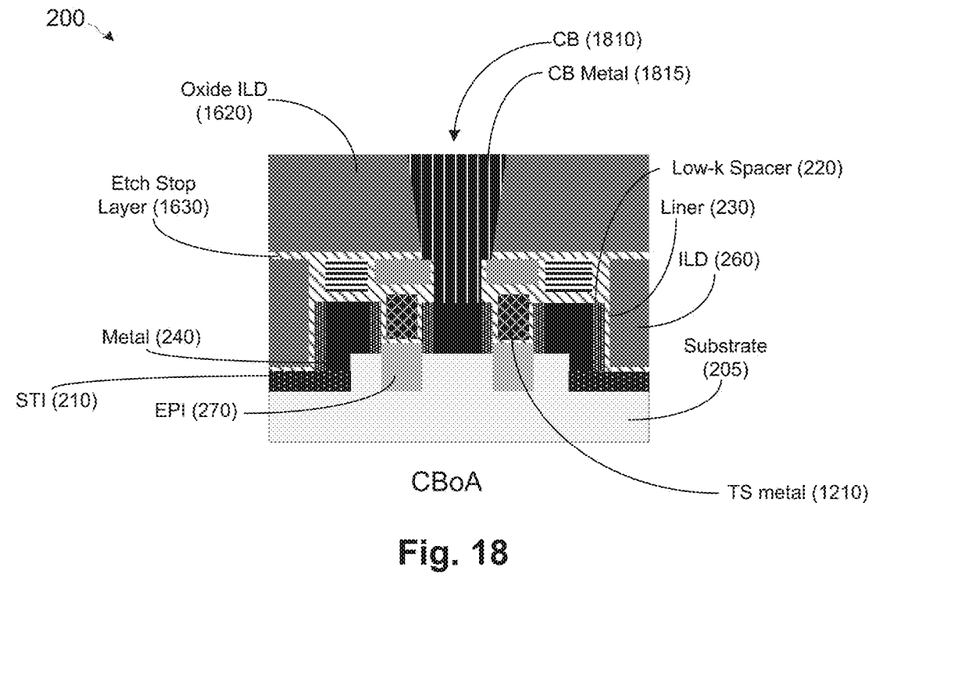
FIG. 18 illustrates a stylized depiction of a cross-sectional view of the device of FIG. 1A with respect to a CB metallization process, in accordance with embodiments herein.
Figure 19:
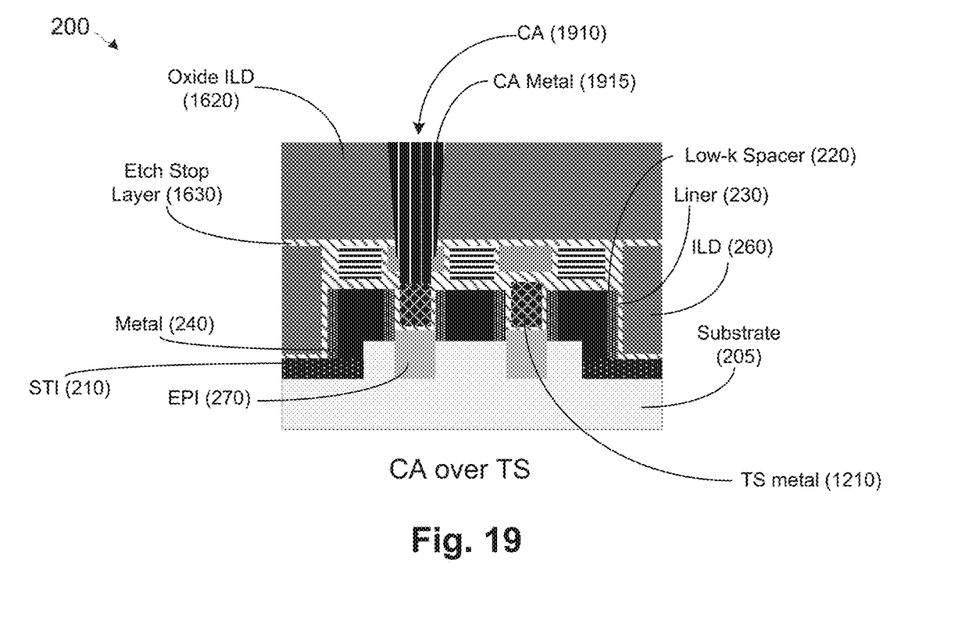
FIG. 19 illustrates a stylized depiction of a cross-sectional view relating to FIG. 1B with respect to a CA metallization processes, in accordance with embodiments herein.

Subsequently in the processing cycle, self-aligned CB RIE and CA RIE processes processes may be performed. Turning now simultaneously to FIGS. 18 and 19, FIG. 18 illustrates a stylized depiction of a cross-sectional view of the device 200 relating to FIG. 1A with respect to a CB metallization process, in accordance with embodiments herein. FIG. 19 illustrates a stylized depiction of a cross-sectional view relating to FIG. 1B with respect to a CA metallization processes, in accordance with embodiments herein.

A metallization process is performed to deposit CB metal 1815 into the CB void 1610 in order to form a CB region 1810, i.e., a CB over active (CBoA) region. The CB metal 1815 may be tungsten, copper, or any other metal suitable for semiconductor processing. A metallization process is also performed to deposit CA metal 1915 into the CA void 1710 in order to form a CA region 1910, i.e., a CA over TS region. The CA metal 1915 may be tungsten, copper, or any other metal suitable for semiconductor processing. The metallization processes may include multiple processes, such as metal deposition process and CMP processes.

After performing the metallization and CMP processes, subsequent processing known to those skilled in the art having benefit of the present disclosure, are performed to complete forming the device 200.

Figure 20:
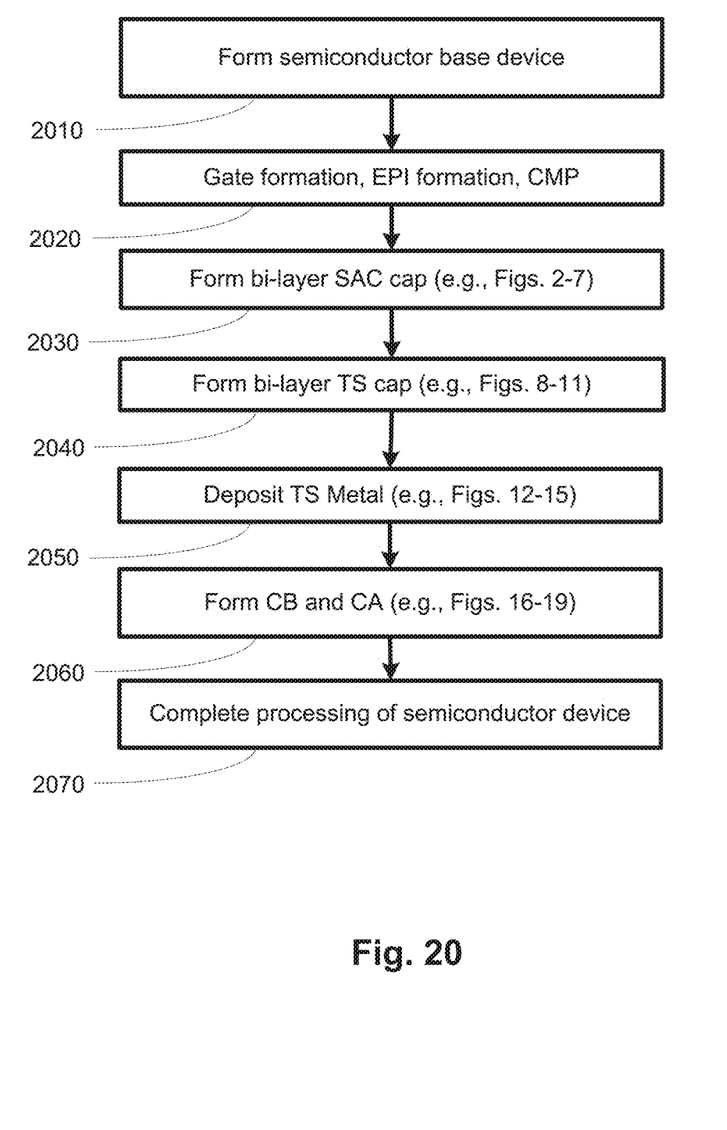
FIG. 20 illustrates a flowchart depiction of a method for manufacturing a device using to form a CBoA region and a CA over TS region, in accordance with embodiments herein.

Turning now to FIG. 20, a flowchart depiction of a method for manufacturing a device using to form a CBoA region and a CA over TS region, in accordance with embodiments herein, is illustrated. A semiconductor base device may be formed (at 2010). This process may include various processing steps, such as forming a substrate, forming multiple layers and features on the substrate.

A plurality of fins, including PFET and NFET fins, as well as a gate region are formed on a substrate layer (at 2120). EPI features may also be formed. Those skilled in the art would appreciate that forming the gate region comprises various process steps, such as forming gate space region, poly gate region, nitride liner, low-k spacer, oxide liner, etc.

Further, using techniques known to those skilled in the art, EPI features may then be formed on the source/drain (S/D) regions (at 1215), as exemplified in FIG. 2. Further, an inter-layer dielectric (ILD) process is performed, which includes performing a TS cut region (at 1220).

Subsequently, bi-layer SAC cap formation processes may be performed, as exemplified in FIGS. 2-7 (at 2030). These processes provide a CBoA and CA regions having bi-layer SAC caps, e.g., an inner SiBCN layer and an outer SiN layer.

Next, bi-layer TS cap processes may be performed, as exemplified in FIGS. 8-11 (at 2040). These processes provides for CBoA and CA regions having regions that may be metallized to form TS features. Subsequently, a TS metallization process may be performed, as exemplified in FIGS. 12-15 (at 2050). Next, CB and CA formation processes may be performed, as exemplified by FIGS. 16-19 (at 2060). This process includes creating a CB void and a CA void and metallizing the voids. This results in a CBoA feature and a CA over TS feature that may have lower rate of shorts to TS metal regions.

Further processes for completing processing/manufacturing of the finFET device 200 may be performed (at 2170). Using principles described herein, those skilled in the art having benefit of the present disclosure would appreciate that the processes described in FIGS. 2-19 may be performed for PMOS devices and for NMOS devices. Further processing may be performed to complete forming the transistor device in accordance with embodiments herein.

Figure 21:
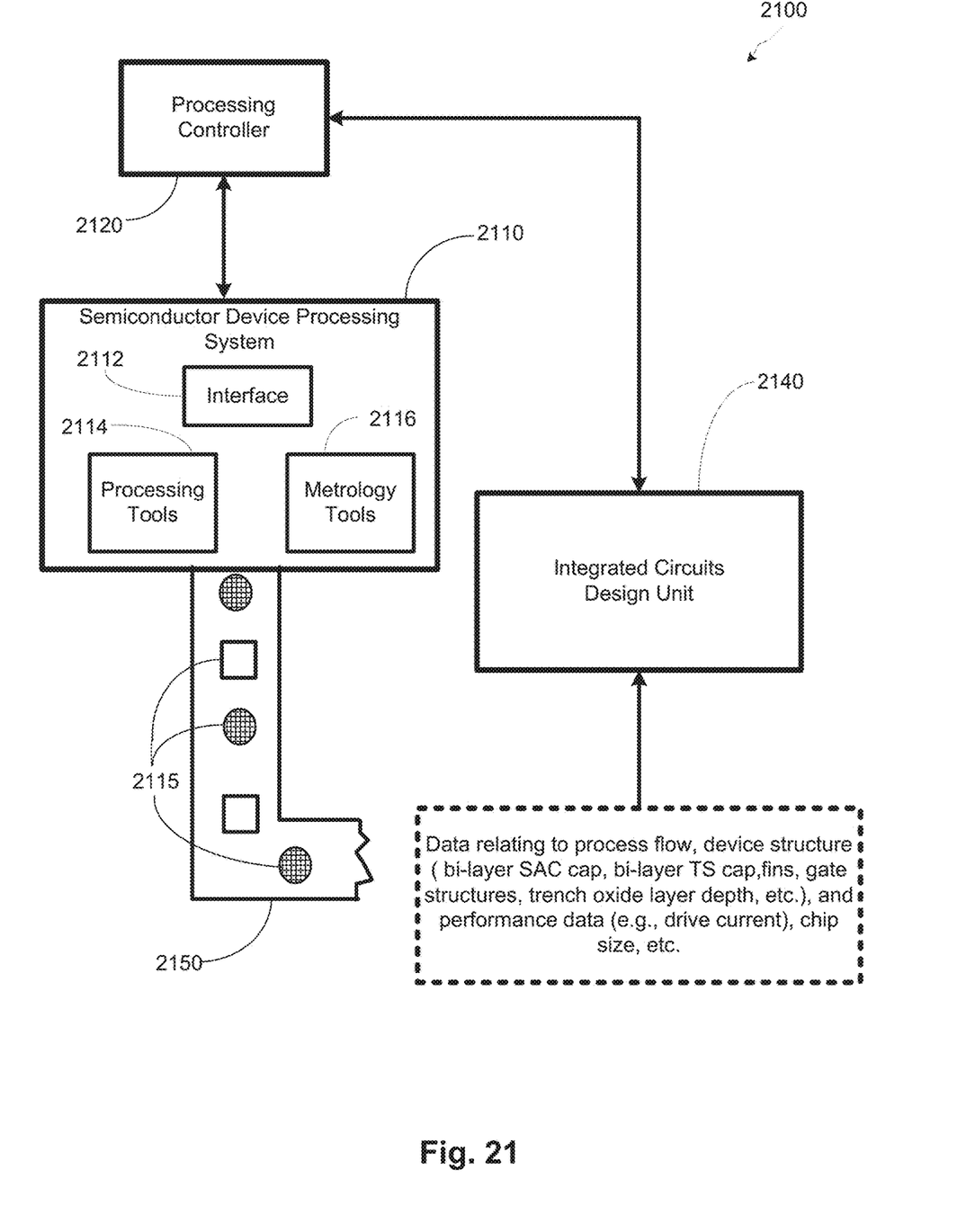
FIG. 21 illustrates a stylized depiction of a system for fabricating a semiconductor device comprising an integrated circuit, in accordance with embodiments herein.

Turning now to FIG. 21, a stylized depiction of a system for fabricating a semiconductor device comprising an integrated circuit, in accordance with embodiments herein, is illustrated. The system 2100 provides for forming bi-layer SAC cap features, bi-layer TS features for forming CBoA and CA over TS regions. This provides for forming a device having including reduced shorts metallization layers, reduced EPI damage, lower leakage currents, etc.

The system 2100 of FIG. 21 may comprise a semiconductor device processing system 2110 and a design unit 2140. The semiconductor device processing system 2110 may manufacture integrated circuit devices based upon one or more designs provided by the design unit 214.

The semiconductor device processing system 2110 may comprise various processing stations, such as etch process stations, photolithography process stations, oxide deposition process stations, CMP process stations, Epitaxy (EPI) process stations, etc. One or more of the processing steps performed by the processing system 2110 may be controlled by the processing controller 2120. The processing controller 2120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2110 may produce integrated circuits on a medium, such as silicon wafers. More particularly, the semiconductor device processing system 2110 produce integrated circuits having finFET devices that comprise CBoA and CB over TS region, as described above.

In some embodiments, the items labeled "1315" may represent individual wafers, and in other embodiments, the items 2115 may represent a group of semiconductor wafers, e.g., a "lot" of semiconductor wafers. The integrated circuit or device 2115 may be a transistor, a capacitor, a resistor, a memory cell, a processor, and/or the like.

The integrated circuit design unit 2140 of the system 2100 is capable of providing a circuit design that may be manufactured by the semiconductor processing system 2110. The integrated circuit design unit 2140 may be capable of determining the number of devices (e.g., processors, memory devices, etc.) to place in a device package, CB and CA specifications, TS feature specifications, and other process specifications. The integrated circuit design unit 2140 may also determine the height of the fins, the size of the fin channels, CBoA specifications, CA specifications, TS specifications, etc. Based upon such details of the devices, the integrated circuit design unit 2140 may determine specifications of the finFETs that are to be manufactured. Based upon these specifications, the integrated circuit design unit 2140 may provide data for manufacturing a semiconductor device having the features provided by embodiments herein.

The system 2100 may be capable of performing analysis and manufacturing of various products involving various technologies. For example, the system 2100 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
  forming a plurality of fins on a semiconductor substrate;
  forming, over a portion of the fins, a gate region;
  forming a first trench silicide (TS) metal feature and a second TS metal feature adjacent a portion of the gate region, wherein forming the first TS metal feature comprises forming an epitaxial (EPI) region, forming a gap above the epitaxial region, and depositing a metal material in the gap to form the first TS metal feature;
  forming a bi-layer self-aligned contact (SAC) cap over a portion of the gate region;
  removing a portion of the bi-layer SAC cap to form a CB void;
  forming a CB metal in the CB void;
  forming a bi-layer TS cap over the first TS metal feature, wherein forming the bi-layer TS cap comprises forming a first outer layer comprising SiN material above the EPI region, and forming a first inner layer comprising an oxide material over the first outer layer;
  removing a portion of the bi-layer TS cap to form a CA void; and
  forming a CA metal in the CA void.

2. The method of claim 1, wherein forming the first outer layer comprises depositing the SiN material to electrically isolate the first TS metal feature from the first inner layer.

3. The method of claim 1, wherein forming the bi-layer SAC cap comprises:
  forming a second outer layer comprising SiN above a first gate metal of the gate region; and
  forming a second inner layer comprising SiBCN over the second outer layer.

4. The method of claim 3, forming the CB metal comprises:
  forming an etch stop layer above and adjacent the bi-layer SAC cap;
  forming an interlayer dielectric layer above the etch stop layer;
  forming the CB void within the interlayer dielectric layer and the bi-layer SAC cap; and
  depositing the CB metal material in the CB void.

5. The method of claim 1, wherein forming the CA metal comprises:
  forming an etch stop layer above and adjacent the bi-layer TS cap;
  forming an interlayer dielectric layer above the etch stop layer;
  forming a CA void region within the interlayer dielectric layer and the bi-layer TS cap; and
  depositing the CA metal material in the CA void region.

6. A method, comprising:
  forming a plurality of fins on a semiconductor substrate;
  forming, over a portion of the fins, a gate region;
  forming a first trench silicide (TS) metal feature and a second TS metal feature adjacent a portion of the gate region;
  forming a bi-layer self-aligned contact (SAC) cap over a portion of the gate region;
  removing a portion of the bi-layer SAC cap to form a CB void;
  forming a CB metal in the CB void;
  forming a bi-layer TS cap over the first TS metal feature, wherein forming the bi-layer TS cap comprises forming a first outer layer comprising SiN material above an EPI region, and forming a first inner layer comprising an oxide material over the first outer layer;
  removing a portion of the TS cap to form a CA void; and
  forming a CA metal in the CA void.

7. The method of claim 6, wherein forming the first outer layer comprises depositing the SiN material to electrically isolate the first TS metal feature from the first inner layer.

8. The method of claim 6, wherein forming the bi-layer SAC cap comprises:
  forming a second outer layer comprising SiN above a first gate metal of the gate region; and
  forming a second inner layer comprising SiBCN over the second outer layer.

9. The method of claim 6, wherein forming the CA metal comprises:
  forming an etch stop layer above and adjacent the bi-layer TS cap and the bi-layer SAC cap;
  forming an interlayer dielectric layer above the etch stop layer;
  forming a CA void region within the interlayer dielectric layer and the bi-layer TS cap;
  forming the CB void within the interlayer dielectric layer and the bi-layer SAC cap;

depositing the CA metal material in the CA void for forming a CA over TS feature; and depositing the CB metal material in the CB void for forming a CB over active region (CBoA) feature.

\* \* \* \* \*